(12) United States Patent
Kawaguchi et al.

(10) Patent No.: US 7,796,461 B2
(45) Date of Patent: Sep. 14, 2010

(54) SEMICONDUCTOR DEVICE HAVING A PLURALITY OF MEMORY CHIPS

(75) Inventors: Kazuaki Kawaguchi, Kawasaki (JP); Yutaka Shirai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 298 days.

(21) Appl. No.: 11/854,248

(22) Filed: Sep. 12, 2007

(65) Prior Publication Data

US 2008/0062808 A1    Mar. 13, 2008

(30) Foreign Application Priority Data

Sep. 12, 2006   (JP) .............................. 2006-246401

(51) Int. Cl.
*G11C 8/00*    (2006.01)
(52) U.S. Cl. ............................ 365/230.08; 365/230.06; 365/230.03; 365/230.02; 365/230.01
(58) Field of Classification Search ............ 365/230.03, 365/230.06, 227, 230.08, 230.01, 230.02
See application file for complete search history.

(56) References Cited

U.S. PATENT DOCUMENTS 5,613,144 A    3/1997   Hall et al.
5,987,357 A *  11/1999  Prutchi et al. .................. 607/36
6,148,363 A    11/2000  Lofgren et al.
6,282,130 B1   8/2001   Cernea et al.

FOREIGN PATENT DOCUMENTS

| JP | 8-180668   | 7/1996 |
| JP | 10-240607  | 9/1998 |
| JP | 2006-21584 | 8/2006 |

* cited by examiner

*Primary Examiner*—Hoai V Ho
*Assistant Examiner*—Kretelia Graham
(74) *Attorney, Agent, or Firm*—Oblon, Spivak, McClelland, Maier & Neustadt, L.L.P.

(57) ABSTRACT

A semiconductor device comprises a plurality of memory chips; and a controller configured to supply the plurality of memory chips with signals for controlling the plurality of memory chips. The plurality of memory chips include a chip selection signal input section configured to make a drive-targeted memory chip selected or non-selected, based on an input signal. They also include an address signal input section configured to provide a signal to address the memory chip, based on an input signal. They further include a select address signal input section configured to make the plurality of memory chips selected or non-selected, based on an input signal, and configured divertible to the address signal input section.

15 Claims, 8 Drawing Sheets

| /SA | /BDG | /SAIN' |
|---|---|---|
| 1 | 1 | 1 |
| 0 | 1 | 0 |
| 1 | 0 | 0 |
| 0 | 0 | 1 |

| /SA1 | /BDG1 or /FUSE1 | /SA2 | /BDG2 or /FUSE2 | /SAIN" |
|---|---|---|---|---|
| 1 | 1 | 1 | 1 | 1 |
| 0 | 1 | 1 | 1 | 0 |
| 0 | 0 | 1 | 1 | 0 |
| 0 | 0 | 1 | 1 | 1 |
| 1 | 1 | 0 | 0 | 1 |
| 0 | 1 | 0 | 0 | 0 |
| 1 | 0 | 0 | 0 | 0 |
| 0 | 0 | 0 | 0 | 1 |
| 1 | 1 | 0 | 1 | 0 |
| 0 | 1 | 0 | 1 | 0 |
| 1 | 0 | 0 | 1 | 0 |
| 0 | 0 | 0 | 1 | 0 |
| 1 | 1 | 1 | 0 | 0 |
| 0 | 1 | 1 | 0 | 0 |
| 1 | 0 | 1 | 0 | 0 |
| 0 | 0 | 1 | 0 | 0 |

SEMICONDUCTOR DEVICE HAVING A PLURALITY OF MEMORY CHIPS

CROSS-REFERENCE TO RELATED APPLICATION

This application is based upon and claims the benefit of priority from the prior Japanese Patent Application No. 2006-246401, filed on Sep. 12, 2006, the entire contents of which are incorporated herein by reference.

BACKGROUND OF THE INVENTION

1. Field of the Invention

The present invention relates to a semiconductor device having a random access memory (RAM) in multi-chip package (MCP) products.

2. Description of the Related Art

In recent years, achievements of mass-storage and reduced semiconductor memories increase the needs for MCP products.

The dominating MCP includes a RAM such as a low-power synchronous dynamic RAM (LPSDRAM), a static RAM (SRAM), a pseudo-SRAM (PSRAM) and a fast cycle RAM (FCRAM) in combination with a non-volatile memory such as an NAND-type flash memory and an NOR-type flash memory. The above MCP makes it possible to realize a mass-storage RAM in a small space. Therefore, it has been used in a wider range from mobile instruments to supercomputers.

When a command input is given to a normal RAM, a controller generally supplies the RAM with a chip select signal for use in determination to select the RAM or not. Controlling the RAM based only on the chip select signal requires the controller to have chip select pins by the number of RAMs to provide output signals. Namely, the controller is required to have four chip select pins for four RAMs and eight chip select pins for eight RAMs. Thus, the more the number of RAMs to be mounted increases, the more the number of chip select pins of the controller increases.

In accordance with the achievement of mass-storage RAMs, plural RAMs may be replaced with a single mass-storage RAM having a two- or four-fold cell storage. In such the case, a single chip select pin is sufficient while the achievement of mass-storage RAMs requires an increased number of address pins. The achievement of mass-storage leaves undesired chip select pins on the controller. Therefore, the address pins are not designed for the achievement of mass-storage. Accordingly, every RAM replacement requires redesigning the controller and consequently causes a problem associated with increases in cost.

JP 10-240607A (Patent Document 1) discloses a MCP product-related technology associated with a memory system, which includes at least two memory units of different characteristics mounted thereon, and which is configured to switch between the memory units for use on setting a memory use environment or during a job execution. This system includes the mounted memories of different characteristics and is configured to switch between a high-speed accessible memory and a low-speed mass-storage memory for use.

JP 8-180668A (Patent Document 2) discloses a memory system, which includes a logic control element in a memory device to set each memory circuit in a selected state or a non-selected state. This system provides a logic control element in a memory device to make it possible to set each memory circuit in a selected state or a non-selected state.

Even with the Patent Documents 1 and 2, the above problem can not be solved and there designing of the controller is required if the number of memories mounted fluctuates. Namely, the production cost rises.

It is very important for RAMs for mobile instruments, typically LPSDRAMs and PSRAMs, to suppress the production cost and reduce the power consumption as well.

SUMMARY OF THE INVENTION

In an aspect the present invention provides a semiconductor device, comprising: a plurality of memory chips; and a controller configured to supply the plurality of memory chips with signals for controlling the plurality of memory chips, wherein the plurality of memory chips include a chip selection signal input section configured to make the plurality of memory chips selected or non-selected, based on a chip select signal, an address signal input section configured to provide a signal to address the memory chip, based on an address signal, and a select address signal input section configured to make the plurality of memory chips selected or non-selected, based on a select address signal, and configured divertible to the address signal input section.

DETAILED DESCRIPTION OF THE EMBODIMENTS

An embodiment of the semiconductor device according to the present invention will now be described with reference to the drawings.

First Embodiment

Figure 1:
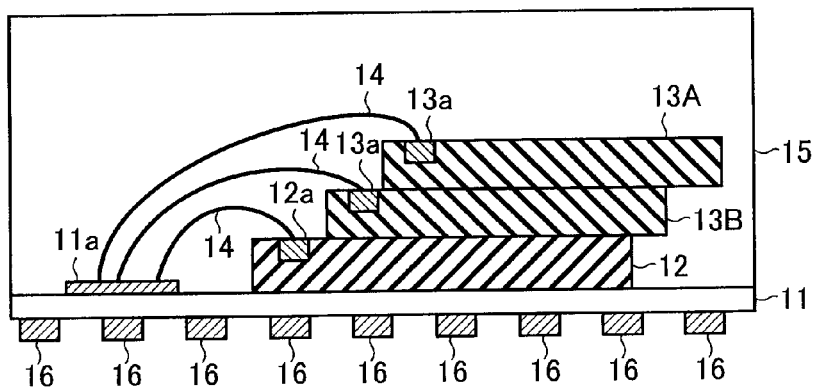
FIG. 1 is a brief diagram of a semiconductor device according to a first embodiment of the present invention.
Figure 2:
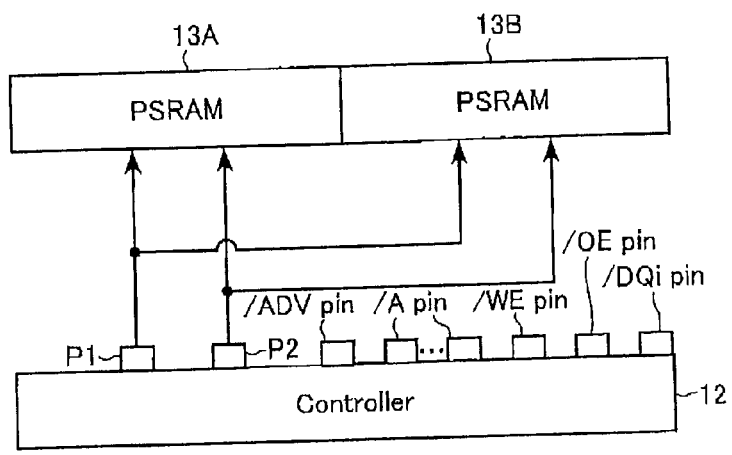
FIG. 2 is a schematic diagram showing signals output from a controller in the semiconductor device according to the first embodiment of the present invention for use in control of selection and non-selection of PSRAMs.
Figure 3:
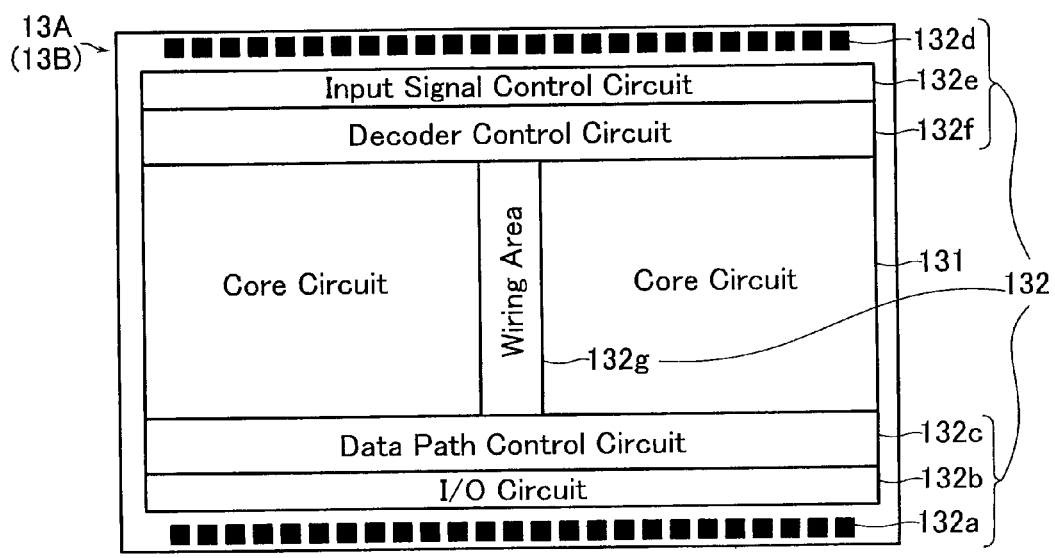
FIG. 3 is a brief diagram of a PSRAM according to the first embodiment of the present invention.

Referring to FIGS. 1-3, a semiconductor device according to a first embodiment of the present invention is described.

FIG. 1 is a brief diagram of the semiconductor device according to the first embodiment. As shown in FIG. 1, the semiconductor device according to the first embodiment mainly comprises a controller 12 stacked on a board 11, and two PSRAMs 13A, 13B stacked on the controller 12.

The PSRAMs 13A, 13B each include one transistor and one capacitor and are more suitable for achieving reduced sizes and mass storage than a conventional SRAM (including six transistors in a full CMOS type). In addition, the PSRAMs 13A, 13B have a function of feeding all addresses at the same time without multiplexing the addresses. The PSRAMs 13A, 13B each contain a circuit capable of automatic refresh in the absence of a refresh command.

The PSRAMs 13A, 13B have a function of controlling the refresh in accordance with an external command input for further facilitating the control by the controller.

The controller 12 and the PSRAMs 13A, 13B have bonding pads 12a, 13a provided thereon. The bonding pads 12a, 13a are electrically connected via bonding wires 14 to a board circuit pattern 11a provided on the board 11. The controller 12, the PSRAMs 13A, 13B and so forth are mounted on the board 11 and sealed in a mold resin 15. The board 11 has a lower surface provided with solder balls 16 thereon. Signals input from the solder balls 16 are supplied via the board circuit pattern 11a and the bonding wires 14 to the controller 12 and the PSRAMs 13A, 13B.

FIG. 2 is a brief diagram illustrative of control signals output from the controller 12 in the semiconductor device according to the first embodiment of the present invention for use in control of the PSRAMs 13A, 13B. As shown in FIG. 2, in the semiconductor device according to the first embodiment of the present invention, the controller 12 has a chip select pin (hereinafter referred to as /CS pin) P1 to provide a signal for use in determination of a selected or non-selected state of the PSRAMs 13A, 13B. It also has a select address pin (hereinafter referred to as /SA pin) P2 having the similar function to the /CS pin P1. The signals from the /CS pin P1 and the /SA pin P2 are branched and supplied to the two PSRAMs 13A, 13B in common. A normally MCP-adaptive semiconductor device has chip select pins by the number of memory chips while the present embodiment only has a single chip select pin for two memory chips (PSRAMs 13A, 13B).

Although not shown in FIG. 2, the controller 12 additionally has an address advance pin (hereinafter referred to as /ADV pin) for use in determination of the input timing of an address; a plurality of address pins (hereinafter referred to as /A pins) provided to feed address information on the PSRAM 13; a write enable pin (hereinafter referred to as /WE pin); an output enable pin (hereinafter referred to as /OE pin); and data I/O pins (hereinafter referred to as /DQi pins).

In a conventional PSRAM the /OE pin is used as an output control pin. In the present embodiment, though, for the purpose of further facilitating the control by the controller, the control under the /OE pin regarding the presence/absence of the data output may be removed from service.

The signal output from the /SA pin P2 is part of signals output from the /A pins and is divertible to a signal output from the /A pin as well.

Hereinafter, the signal output from the /CS pin P1 is represented by /CS, the signal output from the /SA pin P2 by /SA, the signal output from the /ADV pin by /ADV, and the signals output from the /A pins by /A<0> to /A<n>.

FIG. 3 shows a configuration of the PSRAM 13A, 13B chip. The PSRAM 13A, 13B includes a core circuit 131 arranged near the center of the chip, and peripheral circuits 132 arranged on the periphery of the chip to control the core circuit 131 as shown in FIG. 3.

The core circuit 131 includes a memory cell array, a sense amp, a row decoder, a column decoder, and so forth.

The peripheral circuit 132 on one end of the PSRAM 13A, 13B has a group of pads 132a for the /DQi pins, an I/O circuit 132b for the group of pads 132a, and a data path control circuit 132c for execution of data path control, formed thereon.

The peripheral circuit 132 on the other end of the PSRAM 13A, 13B has a group of pads 132d for receiving signals from the control pins (/CS pin, /SA pin, /ADV pin and so forth), an input signal control circuit 132e for execution of input control based on the signals from the control pins, and a decoder control circuit 132f for execution of control of the row and column decoders, formed thereon.

Figure 4:
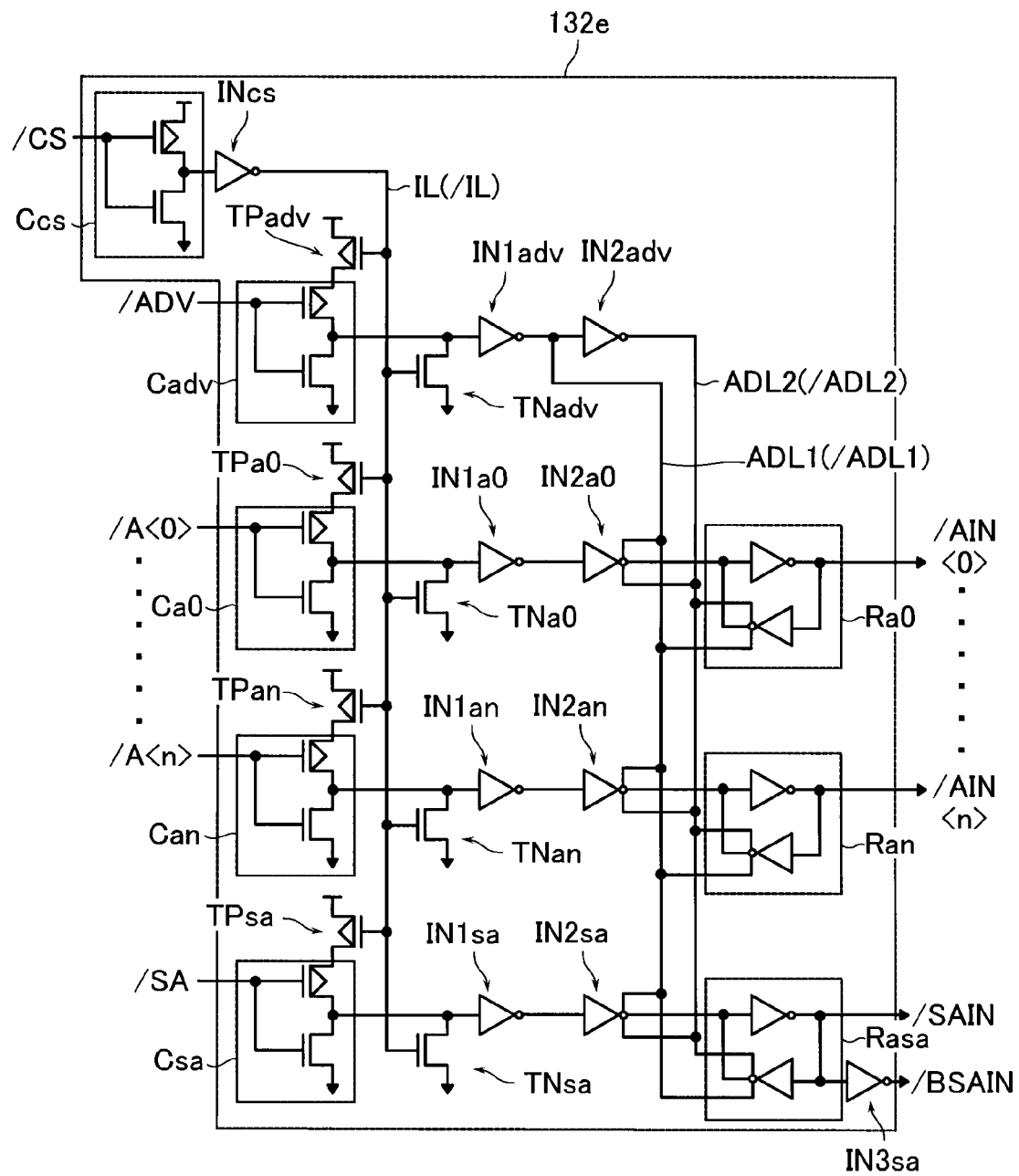
FIG. 4 is a circuit diagram of an input signal control circuit in the semiconductor device according to the first embodiment of the present invention.

Referring next to FIG. 4, a configuration of the input signal control circuit 132e is described. FIG. 4 is a circuit diagram of the input signal control circuit 132e. As shown in FIG. 4, the input signal control circuit 132e includes 2(n+1)+5 P-channel transistors, 2(n+1)+5 N-channel transistors, 2(n+1)+6 inverters, and 2(n+1)+2 clocked inverters (n denotes an arbitrary natural number).

The signal /CS output from the /CS pin P1 is transferred via a CMOS inverter circuit Ccs and an inverter INcs to an input line IL (hereinafter the signal on the input line IL is referred to as /IL). On the other hand, the signal /ADV, the signals /A<0> to /A<n>, and the signal /SA are fed to CMOS inverter circuits Cadv, Ca0-Can, and Csa, respectively.

The signal /CS is fed from the input line IL to the gates of PMOS transistors TPadv, TPa0-TPan, TPsa provided on the source side of the CMOS inverter circuits Cadv, Ca0-Can, Csa.

Output lines from the CMOS inverter circuits Cadv, Ca0-Can, Csa are connected to the drains of NMOS transistors TNadv, TNa0-TNan, TNsa. The NMOS transistors TNadv, TNa0-TNan, TNsa have sources grounded and gates connected to the input line IL.

The signal /ADV from the /ADV pin is transferred from the CMOS inverter circuit Cadv via an inverter IN1adv to a first address control line ADL1 (hereinafter the signal on the first address control line ADL1 is represented by /ADL1). The signal /ADV is also transferred via the inverter IN1adv and an inverter IN2adv to a second address control line ADL2 (hereinafter the signal on the second address control line ADL2 is represented by /ADL2).

The signals /A<0> to /A<n> from the /A pins are fed from the CMOS inverter circuits Ca0-Can via one of inverters IN1a0-IN1an and one of clocked inverters IN2a0-IN2an to latch circuits Ra0-Ran each including one inverter and one clocked inverter. Output signals /AIN<0> to /AIN<n> are then fed from the latch circuits Ra0-Ran to respective memories. The clocked inverters IN2a0-IN2an and the latch circuits Ra0-Ran are supplied with "Low" from the first address control line ADL1. As a result, the inverters IN2a0-IN2an are turned on and permitted to take in the signals /A<0> to /A<n>. Alternatively, the inverters IN2a0-IN2an and the latch circuits Ra0-Ran are supplied with "High" from the first address control line ADL1. As a result, the inverters IN2a0-IN2an are turned off and inhibited to take in the signals /A<0> to /A<n>.

The above-described control of the first address control line ADL1 is executed by the signal /ADV input from the /ADV pin. Minimizing the required number of operations of switching the first address control line ADL1 to "Low" can reduce the number of operations of switching among the signals /A<0> to /A<n>, thereby enabling a low-power operation.

The signal /SA from the /SA pin P2 is fed via two inverters IN1sa, IN2sa and via the first and second address control lines ADL1, ADL2 to the latch circuit Rasa including one inverter and one clocked inverter. The latch circuit Rasa provides two branched signals. One of the signals is provided as a first selection signal /SAIN and the other as a second selection signal /BSAIN via an inverter IN3sa. The similar processing to that to the signals /A<0> to /A<n> is applied to the signal /SA as far as the latch circuit Rasa.

Namely, the signals /A<0> to /A<n> and the signal /SA can be used to execute controls with identical circuits. Therefore, the variation in AC characteristics of the circuits can be reduced so as to make the characteristics even, thereby achieving high-speed processing of the address.

The inverter IN2sa and the latch circuit Ra3sa receive "Low" from the first address control line ADL1. As a result, the inverter IN2sa is turned on and permitted to take in the signal /SA. Alternatively, the latch circuit Rasa receives "High" from the first address control line ADL1. As a result, the inverter IN2sa is turned off and inhibited to take the signal /SA.

Figure 5:
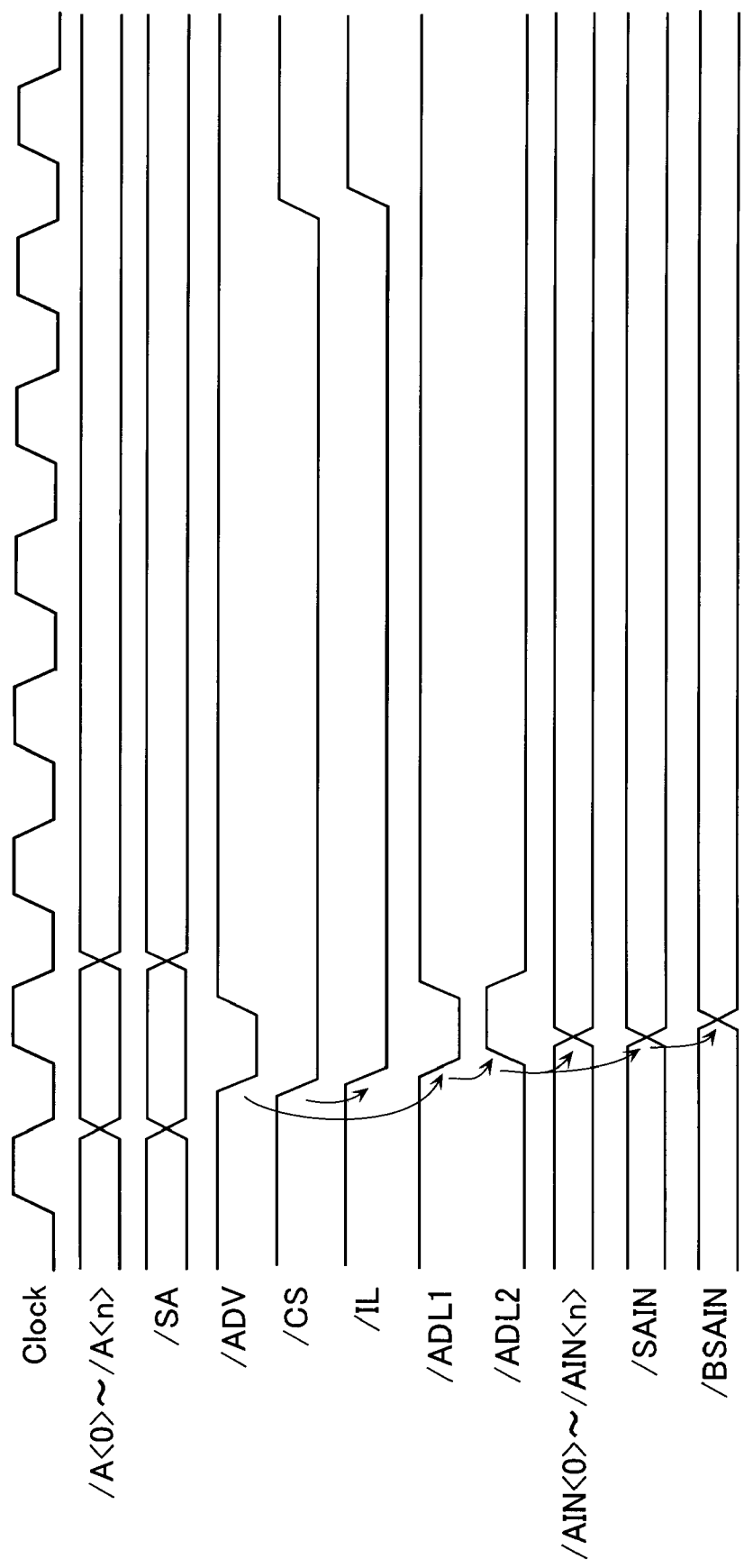
FIG. 5 is a timing chart related to the input signal control circuit in the semiconductor device according to the first embodiment of the present invention.

The operation of the input signal control circuit 132e is described next with reference to FIGS. 4 and 5. FIG. 5 is a timing chart illustrative of the operation of the input signal control circuit 132e.

First, the signal /CS from the /CS pin P1 is switched to "Low" to switch the signal /IL on the input line IL to "Low" via the CMOS inverter Ccs and the inverter INcs. As a result, the gates of the PMOS transistors TPadv, TPa0-TPan, TPsa are brought into the "ON" state. Thus, the input signal control circuit 132e is switched from the standby state that can not receive the signal /ADV, the signals /A<0> to /A<n> and the signal /SA to the active state that can receive them.

Next, the signal /ADV is switched to "Low" to switch the signal /ADL1 on the first address control line ADL1 to "Low" via the CMOS inverter Cadv and the inverter IN1adv. As a result, the signals /A<0> to /A<n> are provided to external as signals /AIN<0> to /AIN<n>.

Thereafter, the signal /ADV is switched to "High" to switch the signal /ADL1 to "High" and disable the signals /A<0> to /A<n> to be provided as the signals /AIN<0> to /AIN<n>.

When the signal /SA is switched to "High" on the other hand, the first selection signal /SAIN is made "High" and the second selection signal /BSAIN is made "Low".

Namely, the first selection signal /SAIN and the second selection signal /BSAIN have opposite characteristics. Therefore, one of the two stacked PSRAMs 13A, 13B, or the PSRAM 13A, may be activated (selected) when the first selection signal /SAIN is at "High" and the other, or the PSRAM 13B, maybe activated when the second selection signal /BSAIN is at "Low". In such the case, the /SA pin P2 can be used to determine selection/non-selection of the PSRAMs 13A, 13B. Thus, in the example shown in FIG. 4, the first selection signal /SAIN is switched to High/Low in response to High/Low of the signal /SA from the /SA pin P2. In contrast with the first selection signal /SAIN, the second selection signal /BSAIN is switched to Low/High, thereby controlling selection/non-selection of the PSRAMs 13A, 13B.

As described above, in the semiconductor device according to the first embodiment of the present invention, selection of an operation-intended PSRAM from the two PSRAMs 13A, 13B can be executed with the use of the signals from the /CS pin P1 and the /SA pin P2. In the semiconductor device the signal from the /SA pin P2 is divertible to the signal /A from the /A pin because of the circuitry thereof.

It is assumed herein that the two PSRAMs 13A, 13B can be replaced with a single PSRAM having memory cells equal to or less than the whole memory cells in the PSRAM 13A and the PSRAM 13B. In this case, one /CS pin is used to control the PSRAM and one /SA pin is divertible to the /A pin. In other words, the first selection signal /SAIN is divertible to the signal /AIN<0> to /AIN<n>.

As described above, in the first embodiment of the present invention, selection/non-selection can be controlled with not the /CS pin but the /SA pin. Even if the number of PSRAMs fluctuates, the signal output from each pin is not wasted but can be utilized usefully. Therefore, in accordance with the present embodiment, the need for redesigning of the memory controller can be reduced and the semiconductor device can be manufactured at low costs.

In other words, the semiconductor device according to the first embodiment is configured such that the /CS pin P1, the CMOS inverter Ccs, the input line IL, the P-type transistors TPadv, TPa0-TPan, TPsa, and the n-type transistors TNadv, TNa0-TNan, TNsa serve as a chip selection signal input section operative to make a drive-targeted memory chip selected or non-selected, based on an input signal.

The /A pins, the CMOS inverters Ca0-Can, the inverters IN1a0-IN1an, IN2a0-IN2an, and the latch circuits Ra0-Ran serve as an address signal input section operative to provide a signal to address the memory chip, based on an input signal.

The /SA pin P2, the CMOS inverter Csa, the inverters IN1sa, IN2sa, the latch circuit Rasa, and the inverter INsa serve as a select address signal input section operative to make a plurality of memory chips selected or non-selected, based on an input signal, and configured divertible to the address signal input section.

The /ADV pin, the CMOS inverter Cadv, the inverters IN1adv, IN2adv, the first address control line ADL1, and the second address control line ADL2 serve as an address advance signal input section operative to control the outputting of signals from the above-described address signal input section and the select address signal input section, based on an address advance signal.

Second Embodiment

Figures 6, 7:
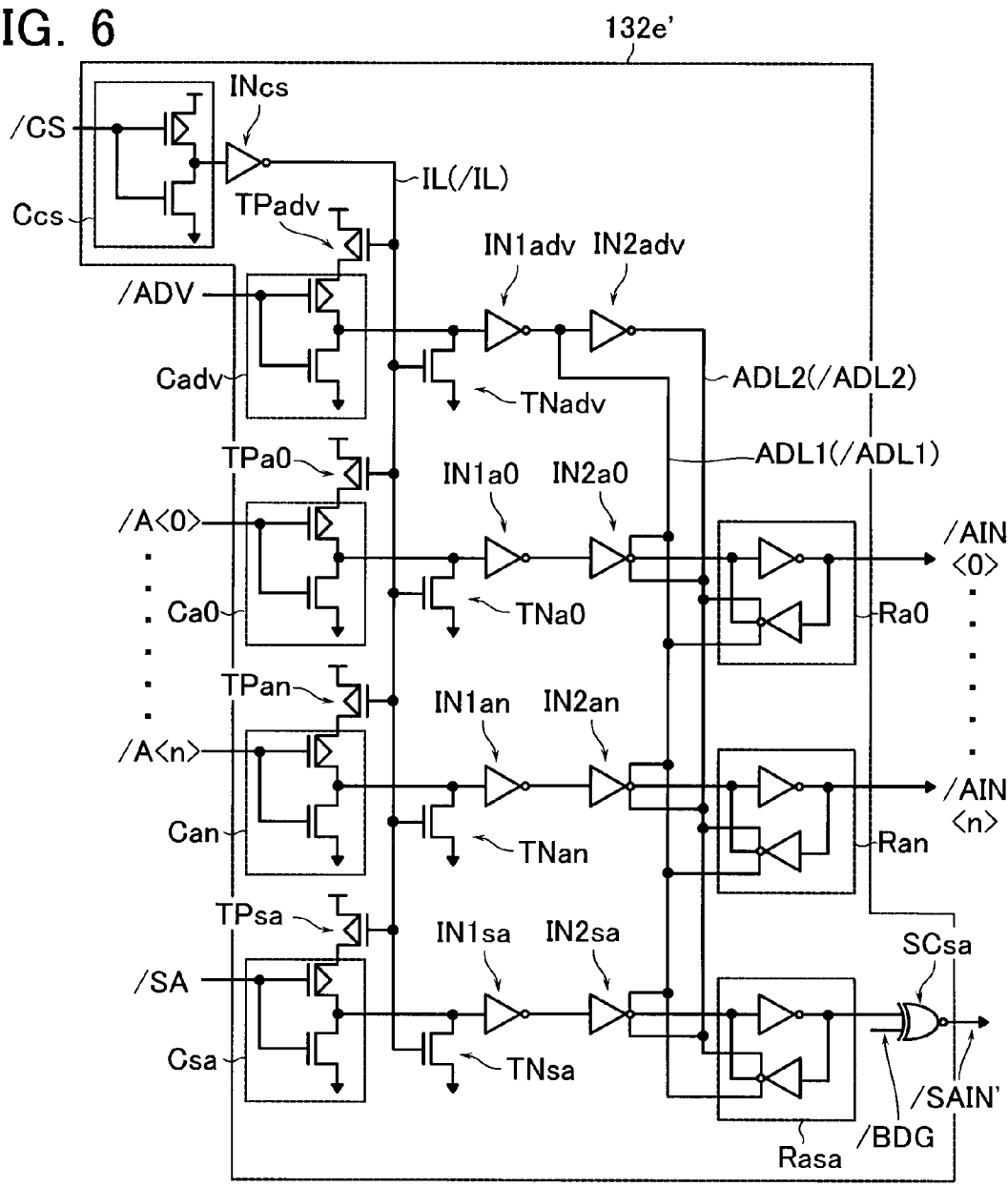
FIG. 6 is a circuit diagram of an input signal control circuit in a semiconductor device according to a second embodiment of the present invention.
FIG. 7 is a truth table related to a select address control circuit in the semiconductor device according to the second embodiment of the present invention.

Referring next to FIGS. 6 and 7, a semiconductor device according to a second embodiment of the present invention is described. The semiconductor device according to the second embodiment of the present invention has the similar configuration to the first embodiment except for an input signal control circuit 132e'. Therefore, the description of the second embodiment is mainly directed to the configuration of the input signal control circuit 132e' as described below.

FIG. 6 is a circuit diagram of the input signal control circuit 132e' in the semiconductor device according to the second embodiment of the present invention. The same elements in FIG. 6 as those in the first embodiment are denoted with the same reference numerals and omitted from the following description. As shown in FIG. 6, different from the input signal control circuit 132e in the first embodiment, a select address control circuit SCsa is provided behind the latch circuit Rasa in the circuit that receives the signal /SA from the /SA pin P2 instead of the inverter IN3sa. The select address control circuit SCsa is an XNOR gate. The select address control circuit SCsa is supplied on the input side with the output signal from the latch circuit Rasa and the output signal from a later-described bonding circuit BDC. In FIG. 6, the same parts as those in the input signal control circuit 132e in the first embodiment are denoted with the same reference numerals and omitted from the following description.

The select address control circuit SCsa operates in accordance with a truth table shown in FIG. 7. In FIG. 7, "1" indicates a state where the signal is at "High" while "0" indicates a state where the signal is at "Low". Namely, if the output signal /BDG from the bonding circuit BDC is at "High", switching the signal /SA to "High" turns the output signal /SAIN' from the select address control circuit SCsa to "High". On the other hand, if the output signal /BDG is at "Low", switching the signal /SA to "Low" turns the output signal /SAIN' to "High".

Accordingly, switching the signal /BDG to "High" or "Low" makes it possible to change the condition for activating PSRAMs chip by chip.

Figure 8:
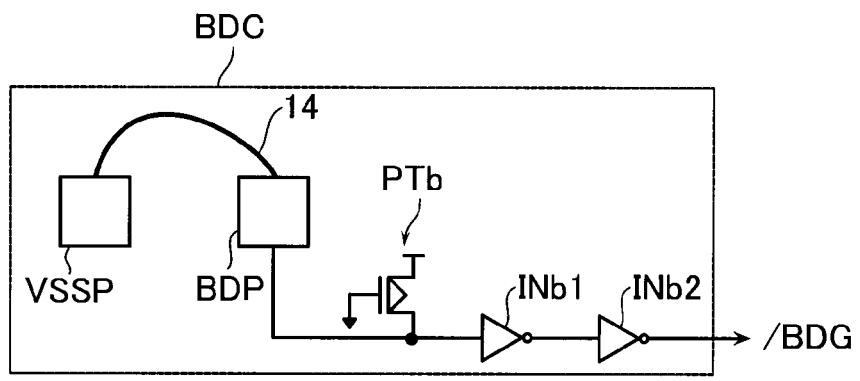
FIG. 8 is a circuit diagram of a bonding circuit in the semiconductor device according to the second embodiment of the present invention.

A specific configuration of the bonding circuit BDC is described next with reference to FIG. 8. As shown in FIG. 8, the bonding circuit BDC includes a ground pad VSSP supplied with the ground potential VSS; a bonding pad BDP connected to the ground pad VSSP through a bonding wire 14; a P-channel transistor PTb; and two inverters INb1, INb2. The P-channel transistor PTb is normally on though it is designed to have extremely low power supply ability.

If the voltage VSS is applied to the bonding pad BDP via the bonding wire 14, the input to the first inverter INb1 is turned to "Low", and accordingly the output signal /BDG from the second inverter INb2 is also turned to "Low". In contrast, if the voltage VSS is not applied to the bonding pad BDP, the normally-on P-channel transistor PTb keeps the input to the first inverter INb1 at "High", and accordingly the output signal /BDG from the second inverter INb2 is also kept at "High".

Namely, the signal /BDG can be switched to Low/High in accordance with the fact that the ground pad VSSP is connected to the bonding pad BDP or not.

In the semiconductor device according to the second embodiment of the present invention as described above, the fact that the bonding pad BDP is connected to the bonding wire 14 or not and the signal /SA is at Low/High can be used to control selection/non-selection of a PSRAM. Similar to the first embodiment, if it is not required to select a PSRAM, the signal /SAIN' is divertible to the signal /A<0> to /A<n>. In a word, the need for redesigning of the memory controller can be reduced and the semiconductor device can be manufactured at low costs. Namely, disconnection of the bonding wire 14 in the bonding circuit BDC makes it divertible to the signal /A<0> to /A<n>.

In other words, the semiconductor device according to the second embodiment is configured such that the select address control circuit SCsa serves as a switching circuit operative to switch an output signal as inverted or not, based on two input signals.

Third Embodiment

Figure 9:
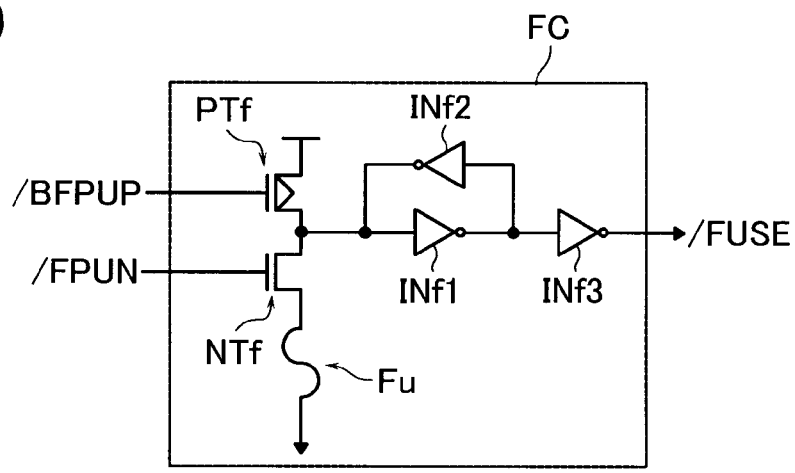
FIG. 9 is a circuit diagram of a fuse circuit in a semiconductor device according to a third embodiment of the present invention.
Figure 10:
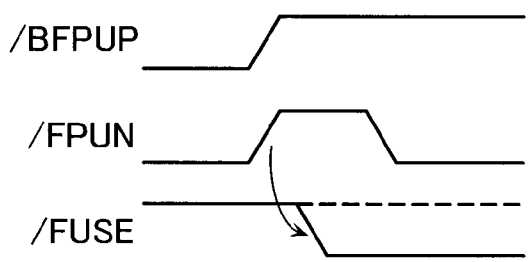
FIG. 10 is a timing chart related to the fuse circuit in the semiconductor device according to the third embodiment of the present invention.

Referring next to FIGS. 9 and 10, a semiconductor device according to a third embodiment of the present invention is described. The semiconductor device according to the third embodiment of the present invention has almost the same configuration as that in the second embodiment. Therefore, the same parts as those in the second embodiment are omitted from the following description. The semiconductor device according to the third embodiment differs from the second embodiment in that a fuse circuit FC is provided instead of the bonding circuit BDC. In this case, the select address control circuit SCsa is configured to receive the signal from the fuse circuit FC. FIG. 9 is a diagram showing a specific configuration of the fuse circuit FC, and FIG. 10 is a diagram of operating waveforms related to the fuse circuit FC.

As shown in FIG. 9, the fuse circuit FC includes a P-channel transistor PTf, an N-channel transistor NTf, and a fuse Fu, which are serially connected, and three inverters INf1-INf3. The inverters INf1 and Inf2 form a latch circuit.

The fuse circuit FC provides a fuse signal /FUSE based on a first input signal /BFPUP fed to the gate of the P-channel transistor PTf and a second input signal /FPUN fed to the gate of the N-channel transistor NTf.

FIG. 10 is a diagram showing operating waveforms related to the fuse circuit FC. As shown in FIG. 10, at the time of power-on, the first input signal /BFPUP is switched from "Low" to "High", and then the second input signal /FPUN is switched from "Low" to "High". Thereafter, the second input signal /FPUN is switched again from "High" to "Low" to terminate the sequence of the input signals /BFPUP and /FPUN at the time of power-on.

If the fuse Fu in FIG. 9 is not disconnected, the input signal to the inverter INf1 adjacent to the P- and N-transistors PTf and NTf is switched to "Low" when the input signals /BFPUP and /FPUN are both turned to "High". In this case, the output signal from the inverter INf3, or the signal /FUSE, is provided to external as "Low".

If the fuse Fu is disconnected on the other hand, the input to the inverter INf1 loses the path to the ground potential and holds "High" and consequently the signal /FUSE also holds "High" even when the input signals /BFPUP and /FPUN are both turned to "High".

Thus, the use of the fuse circuit FC configured to control the signal /FUSE makes it possible to switch the signal /FUSE to Low/High in accordance with the fact that the fuse Fu is disconnected or not.

In the semiconductor device according to the third embodiment of the present invention as described above, the presence/absence of disconnection of the fuse Fu in an identical PSRAM and the fact that the signal /SA is at Low/High can be used to control selection/non-selection of a PSRAM. Similar to the first embodiment, if there is only a single PSRAM and it is not required to select the PSRAM, the signal /SAIN' is divertible to the signal /A<0> to /A<n>. In a word, the need for redesigning of the memory controller can be reduced and the semiconductor device can be manufactured at low costs.

Fourth Embodiment

Figure 11:
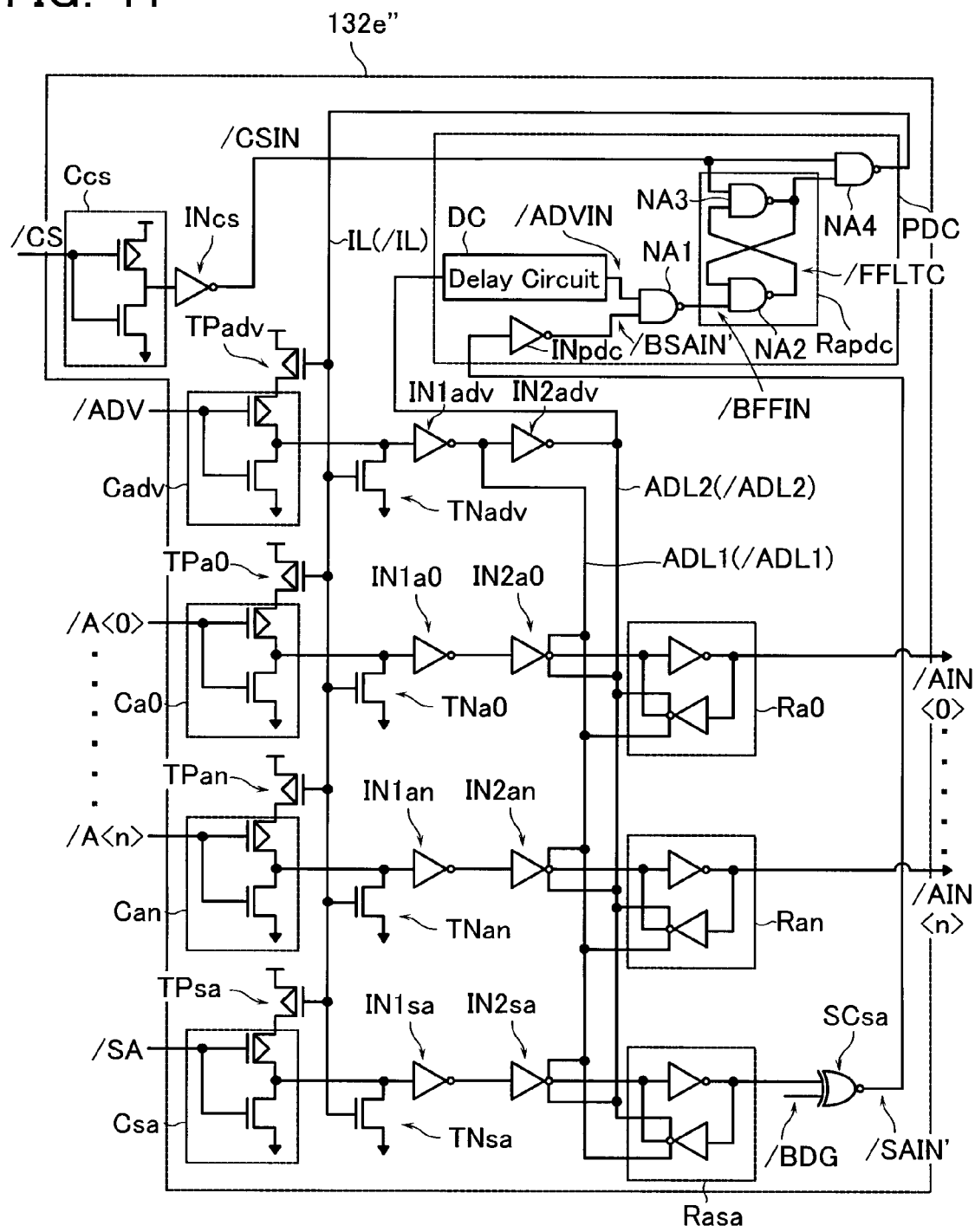
FIG. 11 is a circuit diagram of an input signal control circuit in a semiconductor device according to a fourth embodiment of the present invention.
Figure 12:
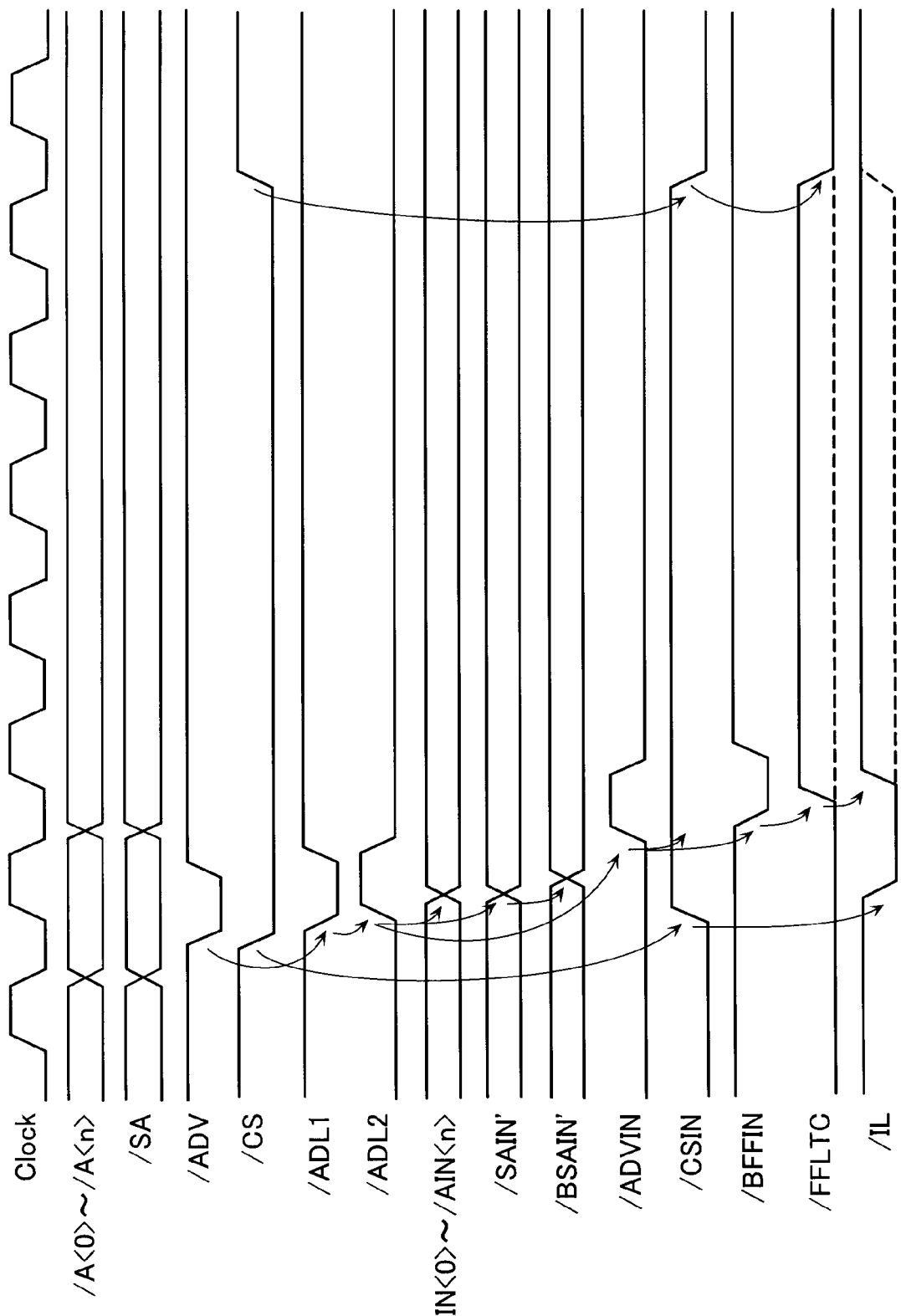
FIG. 12 is a timing chart related to the input signal control circuit in the semiconductor device according to the fourth embodiment of the present invention.

Referring next to FIGS. 11-12, a semiconductor device according to a fourth embodiment of the present invention is described. The semiconductor device according to the fourth embodiment of the present invention has the similar configuration to the second embodiment except for an input signal control circuit 132e". Therefore, the description of the fourth embodiment is mainly directed to the configuration of the input signal control circuit 132e" as described below.

FIG. 11 is a diagram showing the input signal control circuit 132e" in the semiconductor device according to the fourth embodiment of the present invention. FIG. 12 is a timing chart illustrative of the operation in the input signal control circuit 132e". The same elements in FIG. 11 as those in the second embodiment are denoted with the same reference numerals and omitted from the following description.

Different from the second and third embodiments, the input signal control circuit 132e'' in the fourth embodiment is provided with a power-down control circuit PDC configured to control powerdowning the input signal control circuit 132e'' with the input line IL. Based on the signal /CS, the signal /SAIN' and the signal /ADL2, the power-down control circuit PDC switches the signal /IL on the input line IL to "High" or "Low" to control taking in the signal /ADV, the signals /A<0> to /A<n>, and the signal /SA. Namely, the power-down control circuit PDC makes it possible to reduce power consumption. As shown in FIG. 11, the power-down control circuit PDC receives the output signal from the inverter INcs, the output signal /SAIN' from the select address control circuit SCsa, and the signal /ADL2 from the second address line ADL2.

The power-down control circuit PDC includes four NAND gates NA1-NA4, an inverter INpdc, and a delay circuit DC. The inverter INpdc is connected to the output line from the select address control circuit Scsa, and the delay circuit DC is connected to the second address line ADL2. The output lines from the inverter INpdc and the delay circuit DC are connected to the NAND gate NA1. The output line from the NAND gate NA1 and the output line from the NAND gate NA3 are connected to the NAND gate NA2. The output line from the NAND gate NA2 and the output line from the inverter INpdc are connected to the NAND gate NA3. In a word, the NAND gate NA2 and the NAND gate NA3 form a latch circuit Rapdc. The output line from the NAND gate NA3 and the output line from the inverter INcs are connected to the NAND gate NA4 at the input side. The output from the NAND gate NA4 is connected to the input line IL.

In the power-down control circuit PDC, the output signal /SAIN' from the select address control circuit SCsa is fed into the inverter INpdc. On the other hand, the signal from the second address line ADL2 is fed into the delay circuit DC. The output signals from the inverter INpdc and the delay circuit DC are fed into the NAND gate NA1. The output signal /BFFIN from the NAND gate NA1 is fed into the latch circuit Rapdc including the NAND gates NA2, NA3. The latch circuit Rapdc also receives the signal /CSIN from the /CS pin P1 via the CMOS inverter INcs. The output signal from the latch circuit Rapdc and the signal /CSIN are fed into the NAND gate NA4, which provides an output signal as the signal /IL on the input line IL.

Referring now to FIG. 12, the operation of the input signal control circuit 132e'' provided with the power-down control circuit PDC is described next.

In the input signal control circuit 132e'' inactivated in response to the signal /SA, the output signal /SAIN' becomes "Low". Therefore, the output signal /BSAIN' from the inverter INpdc becomes "High", and then the output signal from the NAND gate NA1 switches to "Low" at the timing when the output signal /ADVIN from the delay circuit DC becomes "High". In response to this switching, the output signal /FFLTC from the NAND gate NA2 in the latch circuit Rapdc switches to "High". In response to this, the signal /IL on the input line IL switches to "High" to turn off the P-type transistors TPadv, TPa0-TPan, TPsa. In a word, the signal /ADV and the signals /A<0> to /A<n> are inhibited to enter the input signal control circuit 132e'' and the input signal control circuit 132e'' starts powerdowning. Thereafter, the latch circuit Rapdc holds the output signal /FFLTCH at "High" until the signal /CS becomes "High". When the signal /CS switches to "High", the output signal /FFLTC switches to "Low". In this case, though, the signal /CSIN from the CMOS inverter Ccs switches to "Low" at the same time and accordingly holds the signal /IL at "High". Namely, until the signal /CS switches to "Low" the next time, the input signal control circuit 132e'' is held powerdowned.

In the input signal control circuit 132e'' activated in response to the signal /SA, the output signal /SAIN' becomes "Low" and the signal /BFFIN holds "High". As a result, the signal /FFLTC also holds "Low" and the output signal /CSIN holds "Low". Namely, the input signal control circuit 132e'' retains the active state. Thereafter, the signal /CS switches to "High" to start precharging the core circuits 111, 111. As a result, the signal /IL becomes "High" and the input signal control circuit 132e'' starts powerdowning the CMOS inverter circuits Cadv, Ca0-Can, Csa.

The semiconductor device according to the fourth embodiment as described above can exert the same effects as the second and third embodiments. In the semiconductor device according to the fourth embodiment, powerdowning the CMOS inverter circuits Cadv, Ca0-Can, Csa in the input signal control circuit 132e'' in the inactivated one of the PSRAMs 13A, 13B can reduce power consumption in the PSRAMs 13A, 13B.

In the semiconductor device according to the fourth embodiment, the select address control circuit SCsa is configured to receive the signal /BDG from the bonding circuit BDC though it may be configured to receive the signal /FC from the fuse circuit FC instead.

In the fourth embodiment, the control of minimizing the required number of operations of switching the signal /ADL1 on the first address control line ADL1 to "Low" in response to the above-described signal /ADV can be used in combination to achieve an additional reduction in power consumption based on both effects.

Fifth Embodiment

Figures 13, 14:
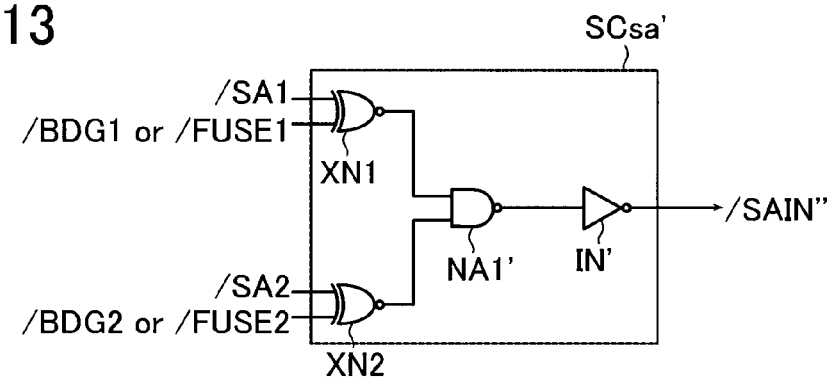
FIG. 13 is a circuit diagram of a select address control circuit in a semiconductor device according to a fifth embodiment of the present invention.
FIG. 14 is a truth table related to the select address control circuit in the semiconductor device according to the fifth embodiment of the present invention.

Referring next to FIGS. 13 and 14, a semiconductor device according to a fifth embodiment of the present invention is described. The semiconductor device according to the fifth embodiment has the similar configuration to the first embodiment except for an input signal control circuit and has a characteristic in the configuration of a select address control circuit SCsa' in the input signal control circuit.

FIG. 13 is a circuit diagram showing the select address control circuit SCsa' in the semiconductor device according to the fifth embodiment of the present invention. FIG. 14 is a truth table related to the select address control circuit SCsa'. In FIG. 14, "1" indicates a state where the signal is at "High" while "0" indicates a state where the signal is at "Low".

The select address control circuit SCsa' according to the fifth embodiment determines an output signal based on signals /SA1 and /SA2 output from two /SA pins, and signals /BDG1 and /BDG2 output from two bonding circuits BDC (or signals /FUSE1 and /FUSE2 output from two fuse circuits FC).

The select address control circuit SCsa' includes two exclusive-NOR gates XN1 and XN2, an NAND gate NA' supplied with output signals there from, an inverter IN' supplied with an output signal from the NAND gate NA' as shown in FIG. 13. The exclusive-NOR gates XN1 and XN2 receive the output signals /BDG1 and /BDG2 from the two bonding circuits (or the output signals /FUSE1 and /FUSE2 from the two fuse circuits), and the signals /SA1 and /SA2.

The select address control circuit SCa' in FIG. 13 can execute a command corresponding to one of four different combinations of the signals /SA1 and /SA2 in accordance with the output signal /BDG1 or /FUSE1 and the output signal /BDG2 or /FUSE2, which are switched to "Low" or "High" as shown in the truth table of FIG. 14.

The semiconductor device according to the fifth embodiment of the present invention makes it possible to control four PSRAMs independently based on the signals /SA1 and /SA2 from two /SA pins provided on the controller.

If the numbers of the /SA pins and the bonding circuits BDC or fuse circuits FC are both increased to x (x denotes an arbitrary natural number), $2^x$ PSRAMs can be controlled independently.

The semiconductor device according to the fifth embodiment makes it possible to control selection/non-selection of a plurality of PSRAMs using the signal /CS and the signal /SA. In accordance with the number of PSRAMs, under the control with the common signal /CS, the signal /SAIN" is divertible to the signal /A<0> to /A<n>. Therefore, the need for redesigning of the memory controller can be reduced and the semiconductor device can be manufactured at low costs.

The embodiments of the invention have been described above though the present invention is not limited to these but rather can be given various modifications, additions, replacements and so forth without departing from the scope and spirit of the invention. For example, PSRAMs are used in the above embodiments though other memories may be used.

What is claimed is:

1. A semiconductor device, comprising:
a plurality of memory chips; and
a controller configured to supply said plurality of memory chips with signals for controlling said plurality of memory chips,
wherein said plurality of memory chips include
a chip selection signal input section configured to make said plurality of memory chips selected or non-selected, based on a chip select signal,
an address signal input section configured to provide a signal to address said plurality of memory chips, based on an address signal,
a select address signal input section configured to make said plurality of memory chips selected or non-selected, based on a select address signal, and configured to be diverted to said address signal input section, and
an address advance signal input section configured to control the outputting of signals from said address signal input section and said select address signal input section, based on an address advance signal.

2. The semiconductor device according to claim 1, wherein said address signal input section is permitted or inhibited to output a signal, based on a signal output from said chip selection signal input section.

3. The semiconductor device according to claim 1, wherein said select address signal input section is permitted or inhibited to output a signal, based on a signal output from said chip selection signal input section.

4. The semiconductor device according to claim 1, wherein said address advance signal input section includes a first inverter arranged to receive said address advance signal,
wherein said address signal input section includes
a second inverter arranged to receive said address signal, and
a third inverter arranged to receive a signal output from said second inverter,
wherein said first inverter is permitted or inhibited to output a signal, based on a signal output from said chip select signal input section,
wherein said second inverter is permitted or inhibited to output a signal, based on a signal output from said chip select signal input section,
wherein said third inverter is permitted or inhibited to output a signal, based on a signal output from said address advance signal input section.

5. The semiconductor device according to claim 4,
wherein said select address signal input section further includes
a fourth inverter arranged to receive said select address signal, and
a fifth inverter arranged to receive a signal output from said second inverter,
wherein said first inverter is permitted or inhibited to output a signal, based on a signal output from said chip select signal input section,
wherein said fourth inverter is permitted or inhibited to output a signal, based on a signal output from said chip select signal input section,
wherein said fifth inverter is permitted or inhibited to output a signal, based on a signal output from said address advance signal input section.

6. A semiconductor device, comprising:
a plurality of memory chips; and
a controller configured to supply said plurality of memory chips with signals for controlling said plurality of memory chips,
wherein said plurality of memory chips include
a chip selection signal input section configured to make said plurality of memory chips selected or non-selected, based on a chip select signal,
an address signal input section configured to provide a signal to address said plurality of memory chips, based on an address signal, and
a select address signal input section configured to make said plurality of memory chips selected or non-selected, based on a select address signal, and configured to be diverted to said address signal input section,
wherein said select address signal input section includes a switching circuit operative to switch art output signal as inverted or not, based on two input signals.

7. The semiconductor device according to claim 6, further comprising a bonding circuit configured to supply said switching circuit with a signal that fluctuates in accordance with the presence/absence of a bonding wire connected to a bonding pad.

8. The semiconductor device according to claim 7, wherein said bonding circuit is one of a plurality of such bonding circuits,
wherein said switching circuit switches an output signal as inverted or not, based on signals output from said plurality of bonding circuits.

9. The semiconductor device according to claim 6, further comprising a fuse circuit configured to supply said switching circuit with a signal that fluctuates in accordance with the presence/absence of disconnection of a fuse.

10. The semiconductor device according to claim 9, wherein said fuse circuit is one of a plurality of such fuse circuits,
wherein said switching circuit switches an output signal as inverted or not, based on signals output from said plurality of fuse circuits.

11. A semiconductor device, comprising:
a plurality of memory chips; and
a controller configured to supply said plurality of memory chips with signals for controlling said plurality of memory chips, wherein said plurality of memory chips include
a chip selection signal input section configured to make said plurality of memory chips selected or non-selected, based on a chip select signal,
an address signal input section configured to provide a signal to address said plurality of memory chips, based on an address signal, and
a select address signal input section configured to make said plurality of memory chips selected or non-selected, based on a select address signal, and configured to be diverted to said address signal input section,
wherein the semiconductor device further comprises a power-down control circuit configured to inhibit said address signal input section to receive any input, thereby reducing power consumption, based on an output signal from said select address signal input section and an output signal from said chip address signal input section.

12. The semiconductor device according to claim 1, wherein said plurality of memory chips, comprises a pseudo-static RAM.

13. The semiconductor device according to claim 1, further comprising:
a board; and
a board circuit pattern provided on said board,
wherein said plurality of memory chips and said memory controller have boding pads,
wherein said boding pads are electrically connected to said board circuit pattern through wire boding,
wherein said plurality of memory chips and said memory controller are stacked on said board.

14. The semiconductor device according to claim 1, wherein said plurality of memory chips includes
a core circuit arranged near the center of said plurality of memory chips, and
a peripheral circuit arranged on the periphery of said plurality of memory chips to control said core circuit.

15. The semiconductor device according to claim 14, wherein said core circuit includes a row decoder and a column decoder,
wherein said peripheral circuit includes
a group of pads arranged to receive signals output from control pins, and
a decoder control circuit configured to control said row decoder and said column decoder.

* * * * *